United States Patent [19]

Miller

[11] Patent Number: 4,808,848
[45] Date of Patent: Feb. 28, 1989

[54] COMPARATOR CIRCUIT

[75] Inventor: Ira Miller, Tempe, Ariz.

[73] Assignee: Motorola, Inc., Schaumburg, Ill.

[21] Appl. No.: 164,665

[22] Filed: Mar. 7, 1988

[51] Int. Cl.[4] .................................................. H03K 5/24
[52] U.S. Cl. ..................................... 307/355; 307/362;
307/494; 307/495
[58] Field of Search ............... 307/350, 355, 362, 491,
307/494, 495, 497

[56] References Cited

U.S. PATENT DOCUMENTS 3,872,323  3/1975  Frederiksen et al. .
4,401,901  8/1983  Ochi ...................................... 307/362
4,670,671  6/1987  DeWeck ............................... 307/362
4,717,839  1/1988  Miller .

Primary Examiner—John Zazworsky
Attorney, Agent, or Firm—William E. Koch

[57] ABSTRACT

A high speed differential to single ended comparator manufactured with a CMOS process utilizes parasitic bipolar transistors for providing a high transconductance, a low offset voltage, a low input to output response time, small physical area, improved matching characteristics, and reduced complexity and number of process steps involved in manufacturing the device. A feedback circuit maintains the output current constant when the input signals are in a steady state.

16 Claims, 1 Drawing Sheet

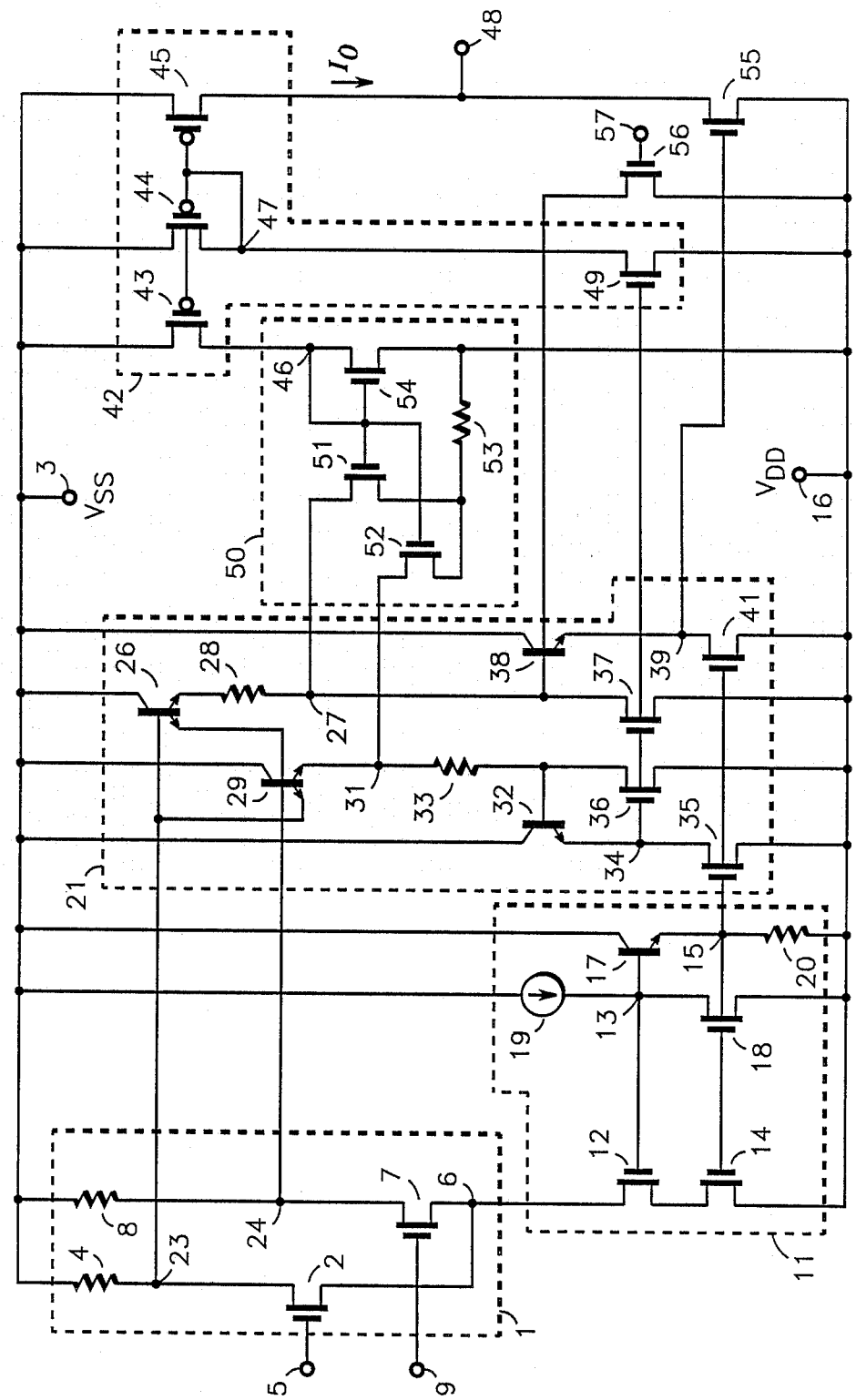

4,808,848

COMPARATOR CIRCUIT

FIELD OF THE INVENTION

This invention relates in general to comparator circuits, and more particularly, to a high speed differential to single ended comparator manufactured with a CMOS process utilizing parasitic bipolar transistors and having a high transconductance, a low offset voltage, a low input to output response time, small physical area, improved matching characteristics, and reduced complexity and number of process steps involved in manufacturing the device.

BACKGROUND OF THE INVENTION

Many forms of comparator circuits are generally known in the art for comparing an input signal to a reference signal to produce an output signal indicative of some predetermined relationship therebetween. Applications for comparator circuits include level detectors, multivibrators, line receivers, sense amplifiers, phase locked loop circuits and pulse generators. Generally, these comparison circuits comprise a differential amplifier circuit wherein a reference potential is applied at one input thereof and an input signal is applied to the other input. A particular kind of load circuitry is connected to the differential amplifier circuit for producing the output signal when the input signal obtains a predetermined relationship with respect to the reference signal. For example, U.S. Pat. No. 3,872,323 to Thomas M. Frederiksen et al., issued Mar. 18, 1975, discloses a comparison circuit comprising such a differential amplifier and a differential to single ended converter circuit which is exemplary of the prior art. U.S. Pat. No. 4,717,839 to Applicant, issued Jan. 5, 1988, discloses a comparator circuit having improvements over the Frederiksen et al. patent.

However, it is well known in the semiconductor industry that the final cost of a monolithic integrated circuit is a function of the complexity and the number of process steps involved in manufacturing the device It is therefore desirable to take advantage of as simple as a process as possible, such as a single metal layer P-well process. Previously known CMOS comparators generally require a high input offset voltage and have a slow input to output response time It is also known that NPN transistors, as used in the above referenced issued patents, have higher transconductance, a lower offset voltage, better matching characteristics, and smaller area requirements than the N-channel transistor.

Thus, what is needed is a differential to single ended comparator manufactured with a CMOS process utilizing parasitic bipolar transistors and having a high transconductance, a low offset voltage, a low input to output response time, small physical area, improved matching characteristics, and reduced complexity and number of process steps involved in manufacturing the device.

SUMMARY OF THE INVENTION

Accordingly, it is an object of the present invention to provide an improved comparator circuit.

Another object of the present invention is to provide a comparator circuit manufactured with a CMOS process having a low offset voltage.

Yet another object of the present invention is to provide a comparator circuit manufactured with a CMOS process having a high transconductance.

Still another object of the present invention is to provide a comparator circuit manufactured with a CMOS process having a low input to output response time.

In carrying out the above and other objects of the invention in one form, there is provided a comparator circuit manufactured with a CMOS process having first and second supply voltage terminals, a first input terminal for receiving a first logic input, a second input terminal for receiving a second logic input, and an output node for providing a logic output which is determined by the states of the first and second logic inputs. A first parasitic bipolar transistor has a collector coupled to the first supply voltage terminal, a base coupled to the first input terminal by an input circuit, a first emitter coupled to the second input terminal by the input circuit, and a second emitter coupled to a first node by a first resistor. A second parasitic bipolar transistor has a collector coupled to the first supply voltage terminal, a base coupled to the second input terminal, a first emitter coupled to the first input terminal, and a second emitter coupled to a second node. A first field effect transistor has a drain coupled to the second node by the second resistor, a gate coupled to a third node, and a source coupled to the second supply voltage terminal. A second field effect transistor has a drain coupled to the first node, a gate coupled to the third node, and a source coupled to the second supply voltage terminal. A third parasitic bipolar transistor has a collector coupled to the first supply voltage terminal, a base coupled to the drain of the first field effect transistor, and an emitter coupled to the third node. A fourth parasitic bipolar transistor has a collector coupled to the first supply voltage terminal, a base coupled to the first node, and an emitter coupled to the output node. First and second current sources are coupled between the third and output nodes, respectfully, and the second supply voltage terminal. A fifth field effect transistor has a drain coupled to said output terminal, a gate coupled to the output node, and a source coupled to the second supply voltage terminal. A first current mirror is coupled between the first supply voltage terminal and the output terminal and to a third current source mirrors a current supplied from the third current source to said output terminal and a fourth node. A second current mirror coupled between the first and second supply voltage terminals and between the output node and both the first and second nodes balances the current conditions at said first and second nodes in response to the current at the fourth node.

The above and other objects, features, and advantages of the present invention will be better understood from the following detailed description taken in conjunction with the accompanying drawing.

BRIEF DESCRIPTION OF THE DRAWING

The single FIGURE is a schematic of the preferred embodiment.

DETAILED DESCRIPTION OF THE INVENTION

Referring to the single FIGURE, differential input stage 1 comprises N-channel transistor 2 having a drain coupled to supply voltage terminal 3 by resistor 4, a gate connected to input terminal 5, and a source connected to node 6. N-channel transistor 7 has a drain coupled to terminal 3 by resistor 8, a gate connected to input terminal 9, and a source connected to node 6. The signals applied to input terminals 5 and 9 may be differential input signals or either of the signals may be a reference signal to which the input signal applied to the other terminal would be compared. Differential input stage 1 amplifies the input signal or signals, with an output from the differential input stage 1 taken from the drains of transistors 2 and 7.

Biasing network 11 comprises N-channel transistor 12 having a drain connected to node 6, a gate connected to node 13, and a source connected to the drain of N-channel transistor 14. Transistor 14 has a gate connected to node 15 and a source connected to supply voltage terminal 16. NPN transistor 17 has a collector connected to terminal 3, a base connected to node 13, and an emitter connected to node 15. NPN transistor 17 is a parasitic bipolar transistor, as are all bipolar transistors shown in the circuit of the FIGURE, wherein its collector is the substrate of the circuit monolithically integrated in a CMOS process. N-channel transistor 18 has a drain connected to node 13, a gate connected to node 15, and a source connected to terminal 16. Current source 19 is coupled between terminal 3 and node 13, and resistor 20 is coupled between node 15 and terminal 16. Transistors 12, 14, 17 and 18 form a cascode current mirror for mirroring the current from current source 19 to node 6. Transistor 17 provides a reference voltage at the gate of transistor 12 and connects the gate and drain of transistor 18 so that transistor 18 functions as a diode for the current mirror. A high impedance results at node 6 due to the cascode effect of transistors 12 and 14, resulting in a substantially constant current flowing from bias network 11 during the cycle when the input signals on terminals 5 and 9 are switching states. For example, if the input signal on terminal 5 were decreasing to a lower state, bias network 11 would "pull down" on the source of transistor 7, steering current through node 6 to transistor 2 and producing an increased current at the drain of transistor 7. The drain current of transistor 2 will have decreased. This prevents the reduction of the output differential current from the sources of transistors 2 and 7 (signal gain) by preventing the current through node 6 from decreasing.

Bias network 11 maintains the current at node 6 substantially constant by maintaining the gate voltage of transistor 12 substantially constant. This is accomplished by transistor 17 establishing the gate voltage of transistor 12. This gate voltage is the sum of the gate to source voltage of transistor 14 and the base to emitter voltage of transistor 17. Bipolar transistor 17 results in a lower voltage at the gate of transistor 12 than would an N-channel transistor in its place. Bipolar transistor 17 also provides a lower operating voltage for biasing network 11 than an N-channel transistor and requires less area in the integrated circuit than a combination of N-channel transistors and resistors.

Level shifting network 21 includes parasitic bipolar transistor 26 having a collector connected to terminal 3, a base connected to node 23, a first emitter connected to node 24 and a second emitter coupled to node 27 by resistor 28. Bipolar transistor 29 has a collector connected to terminal 3, a base connected to node 24, a first emitter connected to node 23, and a second emitter connected to node 31. These first emitters of transistors 26 and 29 are optional and are for clamping the differential signals at nodes 23 and 24, respectively. This clamping action improves the switching characteristics of the comparator circuit since nodes 23 and 24 will not be required to "slew" as far to switch signal states during an input signal change. The use of these first emitters of parasitic bipolar transistors 26 and 29 in place of MOS transistors is an improvement due to the lower "on" voltage of the bipolar base-emitter voltage and the exponential characteristics of the base-emitter junction. Bipolar transistor 32 has a collector connected to terminal 3, a base coupled to node 31 by resistor 33, and an emitter connected to node 34. N-channel transistor 35 has a drain connected to node 34, a gate connected to node 15, and a source connected to terminal 16. N-channel transistors 36 and 37 have a drain connected to the base of transistor 32 and node 27, respectively, a source connected to terminal 16, and a gate connected to node 34. Bipolar transistor 38 has a collector connected to terminal 3, a base connected to node 27, and an emitter connected to node 39. N-channel transistor 41 has a drain connected to node 39, a gate connected to node 15, and a source connected to terminal 16. Level shift network 21 shifts the voltage level from nodes 23 and 24 to node 39. Transistors 26, 29, 32, 36 and 37 and resistors 28 and 33 form a current mirror and transistor 38 drives the output at node 39.

Current mirror 42 includes P-channel transistors 43, 44 and 45 having drains connected to node 46, node 47 and output terminal 48, respectively, sources connected to terminal 3, and gates connected to node 47. N-channel transistor 49 has a drain connected to node 47, a gate connected to node 34, and a source connected to terminal 16.

Current mirror 50 includes N-channel transistors 51 and 52 having drains connected to nodes 27 and 31, respectively, gates connected to node 46, and sources coupled to terminal 16 by resistor 53. N-channel transistor 54 has a drain and gate connected to node 46 and a source connected to terminal 16.

N-channel transistor 55 has a drain connected to terminal 48, a gate connected to node 39, and a source connected to terminal 16. Transistor 55 functions as an amplifier for amplifying the signal on node 39 to terminal 48.

N-channel transistor 56 has a drain connected to node 27, a gate coupled to disable terminal 57, and a source connected to terminal 16. A disable signal on terminal 57 causes transistor 56 to turn off transistor 38, and thus transistor 55.

In operation, as the signal at node 24 increases, the current through transistor 36 increases, and is mirrored to transistor 37. When the current through transistor 29 increases, differential input stage 1 reduces the current to the base of transistor 26. Therefore, the current through resistor 28 decreases. The delta current produced by the increase in current through transistor 37 and the decrease in current from resistor 28 discharges node 39 by driving transistor 38. For the opposite situation where the voltage at node 31 decreases and the voltage at node 27 increases, the delta current produced charges node 39.

The current from the drain of transistor 49 is mirrored to the current IO from the drain of transistor 45 and to the current from the drain of transistor 43. This current from the drain of transistor 43 to node 46 provides positive feedback to level shift network 21 at nodes 27 and 31 and establishes a gate to source voltage on transistor 55 such that the current to the drain of transistor 55 matches the current IO from the drain of transistor 45 during a balanced input condition (input signals are not changing). In this balanced condition, it is desirable to have equal drain to source voltages for transistors 36 and 37, and equal voltages across resistors 28 and 33. Note that transistor 55 generally would be large for providing a high transconductance. In the balanced condition, the gate to source voltage of transistors 36 and 37 and the voltage at transistor 55 appears across resistor 28. The current from transistors 36 and 37 is mirrored by transistor 49 to transistor 54. The gate to source voltage of transistor 54 is applied to the gate of transistor 51. Since transistor 51 has resistor 28 at its source, a voltage is developed across resistor 53. The geometries of transistors 51 and 54 are such that the gate to source voltage of transistor 51 is less than the gate to source voltage of transistor 54. This voltage across resistor 53 produces a current which is pulled through resistor 28. The voltage produced across resistor 28 equals the voltage difference between transistor 36 (transistors 36 and 37 being equal) and transistor 55. This allows for transistor 36 and 37 to have small areas, thus reducing the parasitic capacitance in level shift network 21.

By now it should be appreciated that there has been provided a high speed differential to single ended comparator manufactured with a CMOS process utilizing parasitic bipolar transistors and having a high transconductance, a low offset voltage, a low input to output response time, small physical area, improved matching characteristics, and reduced complexity and number of process steps involved in manufacturing the device.

I claim:

1. A comparator circuit comprising:
    an input terminal;
    an output terminal;
    first means coupled to said input terminal for providing a first signal and a second signal in response to an input signal applied to said input terminal;
    second means coupled to said output terminal for providing an output signal at said output terminal;
    third means coupled between said first means and said second means providing a third signal in response to said first and second signals, said second means providing said output signal in response to said third signal, said third signal being shifted in voltage level from said first and second signals;
    fourth means coupled to said output terminal for providing a first current to said output terminal and mirroring the first current to a first node; and
    fifth means coupled between said first node and said third means for adjusting the magnitude of said third signal in response to the first current at said first node.

2. The current according to claim 1 wherein said first means is coupled to a first supply voltage terminal and said circuit further comprises sixth means coupled between said first means and a second voltage terminal for biasing said first means, said sixth means comprising:
    a first effect transistor having a drain coupled to said first means, a gate coupled to a second node, and having a source;
    a second field effect transistor having a drain coupled to the source of said first field effect transistor, a gate coupled to a third node, and a source coupled to said second supply voltage terminal;
    a third field effect transistor having a drain coupled to said second node, a gate coupled to said third node, and a source coupled to said second supply voltage terminal;
    a current source coupled between said first supply voltage terminal and said second node;
    a first resistor coupled between said third node and said second supply voltage terminal; and
    a bipolar transistor having a collector coupled to said first supply voltage terminal, a base coupled to said second node, and an emitter coupled to said third node.

3. The circuit according to claim 2 wherein said first means comprises:
    a second resistor;
    a third resistor;
    a fourth field effect transistor having a drain coupled to said first supply voltage terminal by said first resistor and coupled to said third means for providing said first signal, a gate coupled to said input terminal, and a source coupled to said drain of said first field effect transistor; and
    a fifth field effect transistor having a drain coupled to said first supply voltage by said second resistor and coupled to said third means for providing said second signal, a gate coupled to receive one of a second input signal or a reference voltage, and a source coupled to said drain of said first field effect transistor.

4. The circuit according to claim 1 further including first and second supply voltage terminals, wherein said third means comprises:
    a first resistor;
    a second resistor;
    a first bipolar transistor having a collector coupled to said first supply voltage terminal, a base coupled to said first means for receiving said first signal, a first emitter coupled to a second node by said first resistor;
    a second bipolar transistor having a collector coupled to said first supply voltage terminal, a base coupled to said first means for receiving said second signal, a first emitter coupled to a third node;
    a first field effect transistor having a drain coupled to said third node by said second resistor, a gate coupled to a fourth node, and a source coupled to said second supply voltage terminal;
    a second field effect transistor having a drain coupled to said second node, a gate coupled to said fourth node, and a source coupled to said second supply voltage terminal;
    a third bipolar transistor having a collector coupled to said first supply voltage terminal, a base coupled to the drain of said first field effect transistor, and an emitter coupled to said fourth node;
    a fourth bipolar transistor having a collector coupled to said first supply voltage terminal, a base coupled to said second node, and an emitter coupled to a fifth node;
    a first current source coupled between said fourth node and said second supply voltage terminal; and
    a second current source coupled between said fifth node and said second supply voltage terminal.

5. The circuit according to claim 4 wherein said first bipolar transistor comprises a second emitter coupled to said first means for receiving said second signal, and said second bipolar transistor comprises a second emitter coupled to said first means for receiving said first signal.

6. The circuit according to claim 5 wherein said fifth means comprises:
    a third resistor;

a third field effect transistor having a drain and a gate coupled to said first node, and a source coupled to said second supply voltage terminal;

a fourth field effect transistor having a drain coupled to said third node, a gate coupled to said first node, and a source coupled to said second supply voltage terminal by said third resistor; and a fifth field effect transistor having a drain coupled to said second node, a gate coupled to said first node, and a source coupled to said second supply voltage terminal by said third resistor.

7. The circuit according to claim 7 wherein said fourth means comprises:

a third current source;

a sixth field effect transistor having a source coupled to said first supply voltage terminal, a gate coupled to said second supply voltage terminal by said third current source, and a drain coupled to said output terminal;

a seventh field effect transistor having a source coupled to said first supply voltage terminal, and a gate and a drain coupled to said second supply voltage terminal by said third current source; and an eighth field effect transistor having a source coupled to said first supply voltage terminal, a gate coupled to said second supply voltage terminal by said third current source, and a drain coupled to said first node.

8. The circuit according to claim 7 wherein said second means comprises a ninth field effect transistor having a drain coupled to said output terminal, a gate coupled to said fifth node, and a source coupled to said second supply voltage terminal.

9. A comparator circuit manufactured with a CMOS process having first and second supply voltage terminals, a first input terminal for receiving a first logic input, a second input terminal for receiving a second second logic input, and an output node for providing a logic output which is determined by the states of the first and second logic inputs, said comparator circuit comprising:

a first resistor;

a second resistor;

a first parasitic bipolar transistor having a collector coupled to said first supply voltage terminal, a base coupled to said first input terminal, a first emitter coupled to a first node by said first resistor;

a second parasitic bipolar transistor having a collector coupled to said first supply voltage terminal, a base coupled to said second input terminal, and a first emitter coupled to a second node;

a first field effect transistor having a drain coupled to said second node by said second resistor, a gate coupled to a third node, and a source coupled to said second supply voltage terminal;

a second field effect transistor having a drain coupled to said first node, a gate coupled to said third node, and a source coupled to said second supply voltage terminal;

a third parasitic bipolar transistor having a collector coupled to said first supply voltage terminal, a base coupled to the drain of said first field effect transistor, and an emitter coupled to said third node;

a fourth parasitic bipolar transistor having a collector coupled to said first supply voltage terminal, a base coupled to said first node, and an emitter coupled to the output node;

a first current source coupled between said third node and said second supply voltage terminal; and a second current source coupled between said fourth node and said second supply voltage terminal.

10. The comparator circuit according to claim 9 wherein said first parasitic bipolar transistor comprises a second emitter coupled to said first input terminal, and said second parasitic bipolar transistor comprises a second emitter coupled to said second input terminal.

11. The comparator circuit according to claim 10 further comprising:

an output terminal;

first means coupled between said output terminal and said second supply voltage terminal and to said output node for providing an output signal at said output terminal;

a third current source;

second means coupled between said first supply voltage terminal and said output terminal and to said third current source for mirroring a current supplied from said third current source to said output terminal and a fourth node;

third means coupled between said first and second supply voltage terminal and between said fourth node and both said first and second nodes for balancing the current conditions at said first and second nodes in response to the current at said fourth node.

12. The comparator circuit according to claim 11 wherein said third means comprises:

a third resistor;

a third field effect transistor having a drain and a gate coupled to said fourth node, and a source coupled to said second supply voltage terminal;

a fourth field effect transistor having a drain coupled to said second node, a gate coupled to said fourth node, and a source coupled to said second supply voltage terminal by said third resistor; and a fifth field effect transistor having a drain coupled to said first node, a gate coupled to said fourth node, and a source coupled to said second supply voltage terminal by said third resistor.

13. The comparator circuit according to claim 12 wherein said second means comprises:

a fourth current source;

a sixth field effect transistor having a source coupled to said first supply voltage terminal, a gate coupled to said second supply voltage terminal by said third current source, and a drain coupled to said output terminal;

a seventh field effect transistor having a source coupled to said first supply voltage terminal, and a gate and a drain coupled to said third current source; and an eighth field effect transistor having a source coupled to said first supply voltage terminal, a gate coupled to said third current source, and a drain coupled to said fifth node.

14. The comparator circuit according to claim 13 wherein said first means comprises a ninth field effect transistor having a drain coupled to said output terminal, a gate coupled to said output node, and a source coupled to said second supply voltage terminal.

15. The comparator circuit according to claim 14 further comprising:

fifth means coupled to said first and second input terminals for providing a first signal and a second signal;

a ninth field effect transistor having a drain coupled to said fifth means, a gate coupled to a fifth node, and having a source;

a tenth field effect transistor having a drain coupled to the source of said ninth field effect transistor, a gate coupled to a sixth node, and a source couled to said second supply voltage terminal;

a eleventh field effect transistor having a drain coupled to said fifth node, a gate coupled to said sixth node, and a source coupled to said second supply voltage terminal;

a fifth current source coupled between said first supply voltage terminal and said fifth node;

a fourth resistor coupled between said sixth node and said second supply voltage terminal; and a fifth bipolar transistor having a collector coupled to said first supply voltage terminal, a base coupled to said fifth node, and an emitter coupled to said sixth node.

16. The comparator circuit according to claim 15 further comprising:

a fifth resistor;

a sixth resistor;

a twelfth field effect transistor having a drain coupled to said first supply voltage terminal by said fifth resistor and coupled to the base of said first parasitic bipolar transistor for providing said first signal, a gate coupled to said first input terminal and a source coupled to said drain of said ninth field effect transistor; and a thirteenth field effect transistor having a drain coupled to said first supply voltage by said sixth resistor and coupled to the base of said second parasitic bipolar transistor for providing said second signal, a gate coupled to said second input terminal, and a source coupled to said drain of said ninth field effect transistor.

* * * * *

UNITED STATES PATENT AND TRADEMARK OFFICE
CERTIFICATE OF CORRECTION

PATENT NO.   : 4,808,848
DATED        : February 28, 1989
INVENTOR(S)  : Ira Miller It is certified that error appears in the above-identified patent and that said Letters Patent is hereby corrected as shown below:

Column 5, claim 2, line 51, please delete "current" and insert therefor --circuit--.

Column 5, claim 2, line 56, after "first" please insert --field--.

Signed and Sealed this

Third Day of October, 1989

Attest:

DONALD J. QUIGG

*Attesting Officer*  *Commissioner of Patents and Trademarks*